US012638486B2

(12) United States Patent
Healy

(10) Patent No.: US 12,638,486 B2
(45) Date of Patent: May 26, 2026

(54) SYSTEM AND METHOD FOR ISOLATION RESISTANCE MEASUREMENT

(71) Applicant: Cypress Semiconductor Corporation, San Jose, CA (US)

(72) Inventor: Mark Healy, Cork (IE)

(73) Assignee: Infineon Technologies Americas Corp., El Segundo, CA (US)

( * ) Notice: Subject to any disclaimer, the term of this patent is extended or adjusted under 35 U.S.C. 154(b) by 129 days.

(21) Appl. No.: 18/442,787

(22) Filed: Feb. 15, 2024

(65) Prior Publication Data

US 2025/0076353 A1     Mar. 6, 2025

Related U.S. Application Data

(60) Provisional application No. 63/536,331, filed on Sep. 1, 2023.

(51) Int. Cl.
| *G01R 27/02* | (2006.01) |
| *G01R 31/389* | (2019.01) |
| *G01R 31/52* | (2020.01) |

(52) U.S. Cl.
CPC ......... *G01R 27/025* (2013.01); *G01R 31/389* (2019.01); *G01R 31/52* (2020.01)

(58) Field of Classification Search
None
See application file for complete search history.

(56) References Cited

U.S. PATENT DOCUMENTS

2005/0012506 A1* 1/2005 Yudahira .............. G01R 31/006
                                                                        324/511
2019/0219621 A1* 7/2019 Morimoto .............. G01R 31/52

* cited by examiner

*Primary Examiner* — Jas A Sanghera

(57) ABSTRACT

A system includes a processing device and a measurement circuit coupled to the processing device. The system further includes an auxiliary voltage supply. The processing device and the measurement circuit are powered by the auxiliary voltage supply. The measurement circuit is to apply a test voltage to a first resistor and measure a voltage drop over the first resistor. The processing device is to determine, based on at least the voltage drop, an isolation resistance value between a chassis ground node and at least one of a battery pack or a battery link of a power system.

17 Claims, 7 Drawing Sheets

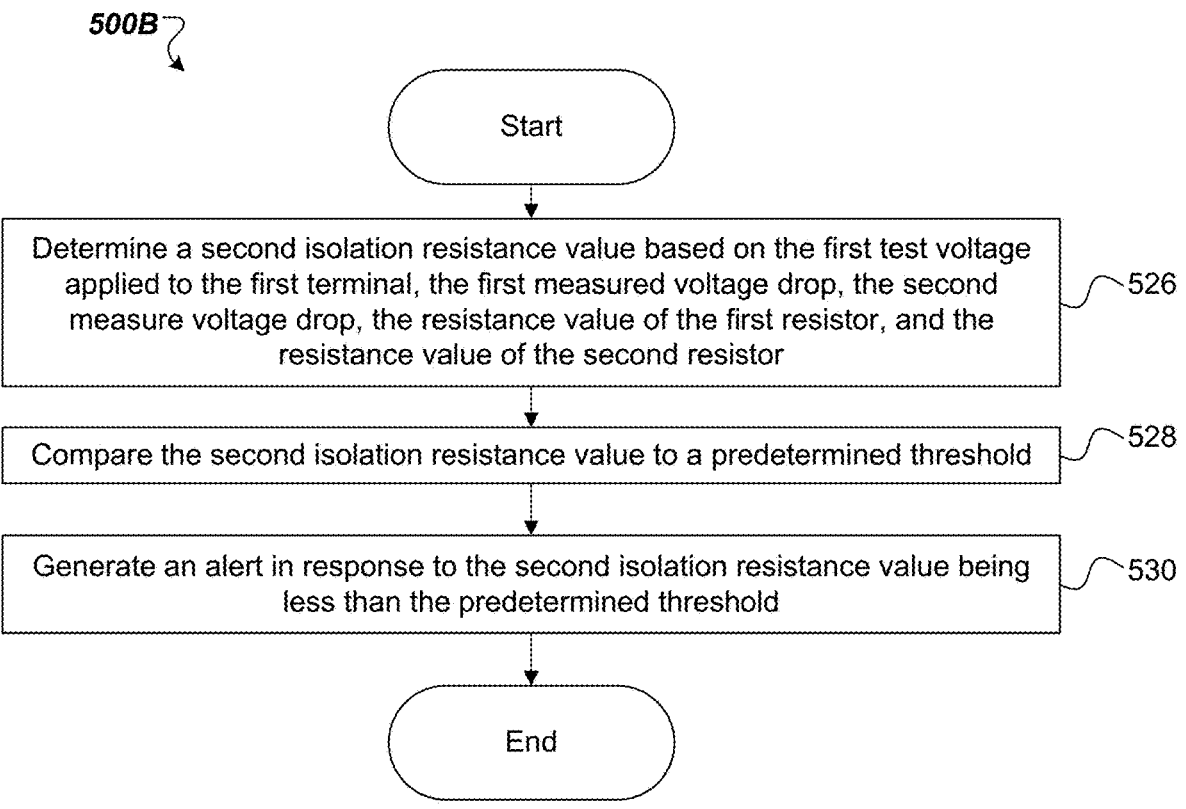

*500B*

Start

Determine a second isolation resistance value based on the first test voltage applied to the first terminal, the first measured voltage drop, the second measure voltage drop, the resistance value of the first resistor, and the resistance value of the second resistor —526

Compare the second isolation resistance value to a predetermined threshold —528

Generate an alert in response to the second isolation resistance value being less than the predetermined threshold —530

End

FIG. 5B

SYSTEM AND METHOD FOR ISOLATION RESISTANCE MEASUREMENT

RELATED APPLICATIONS

This application claims the benefit of U.S. Provisional Patent Application No. 63/536,331 filed Sep. 1, 2023, the entire contents of which are incorporated by reference herein.

TECHNICAL FIELD

The disclosure relates generally to the field of battery management, and in particular, to a system and method for isolation resistance measurement.

BACKGROUND

Battery management systems (BMSs) in electric vehicles (EVs) are responsible for managing the performance, health, and efficiency of the battery pack. A BMS typically comprises various components, including sensors, control units, and connectivity interfaces. These components monitor parameters like voltage, current, temperature, and state of charge, and help to ensure optimal battery operation and longevity. Isolation resistance monitoring for BMS, involves detecting potential leakages or breakdowns in insulation between the high-voltage (HV) battery pack, the vehicle chassis, and other low-voltage (LV) systems. This monitoring is achieved through specialized circuitry which applies test voltages and measures the resulting currents or voltage drops to assess insulation integrity, ensuring safety and compliance with regulatory standards. Electronic circuits, like those used in isolation resistance monitoring, may include individual electronic components, such as resistors, transistors, and capacitors, among others, connected by conductive wires or traces through which electric current can flow.

BRIEF DESCRIPTION OF THE DRAWINGS

The disclosure is illustrated by way of example, and not of limitation, in the figures of the accompanying drawings.

FIG. 5B is a flow diagram of a method associated with isolation resistance monitoring, according to some embodiments.

DETAILED DESCRIPTION

Figure 1:
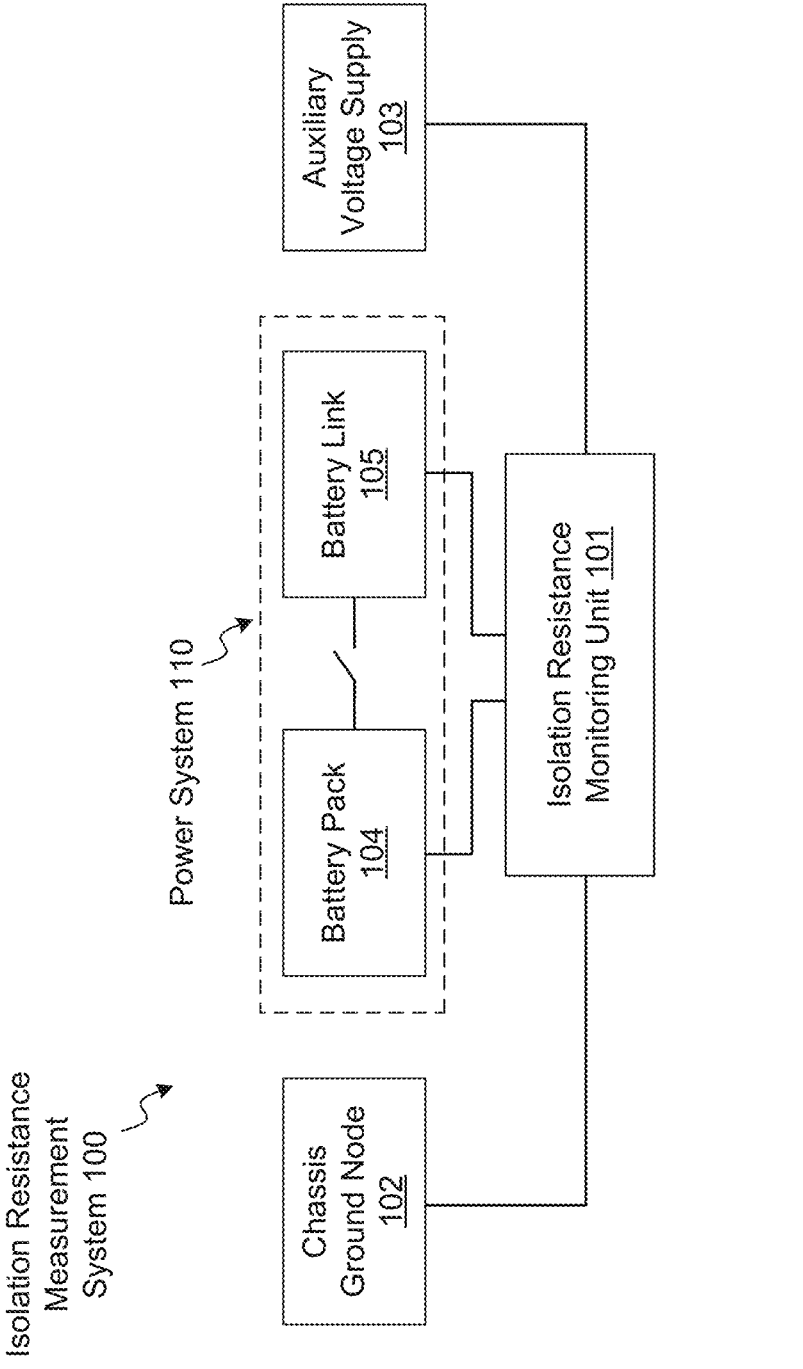
FIG. 1 is a block diagram of an isolation resistance measurement system, according to some embodiments.

In electric vehicles (EVs), the high-voltage (HV) battery pack typically operates at voltages between 200V and 800V.

The low-voltage (LV) circuitry typically operates at 12V and can sit on a chassis ground node of a vehicle chassis (e.g., LV circuitry uses the vehicle chassis for a ground node). For human safety, the HV battery pack must be isolated from the LV circuitry and the vehicle chassis. According to Federal Motor Vehicle Safety Standards (FMVSS), the isolation of the HV battery pack from the LV circuitry and the vehicle chassis requires a resistance of 500 Ω/V, translating to a leakage current limit of, for example, two mA for a 1000V battery. The isolation resistance is monitored and maintained to detect and prevent faults throughout the lifespan of the vehicle.

Additionally, the HV battery link side, which connects the HV battery pack to key components of the vehicle such as the inverter, charger, and DC-DC converter, as well as to the electric motor, requires isolation from the LV circuitry and the vehicle chassis. This becomes challenging when the HV battery link side is disconnected and floating, separate from the HV battery pack voltage.

Conventionally, there are two prevalent methods for isolation resistance monitoring. The first, passive isolation monitoring, includes test loads connected to the positive and negative terminals of both the HV battery pack and HV battery link. While this method can be relatively straightforward and simple, it necessitates both a first device and a first power supply for the HV battery pack isolation monitoring as well as a second device and a second power supply for the HV battery link isolation monitoring while the HV battery link is floating, which can be costly. The second method, active isolation monitoring, employs a separate test voltage for applying a test current to a ground line to then measure a leakage current. This approach can stable and accurate, capable of monitoring both HV battery pack and HV battery link sides with a single device. However, it includes a separate 40V AC voltage source creating a third 40V power domain (in addition to the HV domain and 12V domain), resulting in a more complex and expensive design.

Aspects and implementations of the present disclosure address these and other challenges of the existing technology by employing a system including a processing device (e.g., that performs the calculations for isolation resistance monitoring) and measurement circuitry that are coupled to a chassis ground of LV circuitry powered by an auxiliary voltage supply of an EV. Both the processing device and the measurement circuitry are powered by the same 12V power domain of the auxiliary voltage supply. A test voltage, which is applied to a resistor by the measurement circuit, is also provided by the same auxiliary voltage supply of the EV. The auxiliary voltage supply can be, for example, a 12-volt battery that powers the LV circuitry of the EV. The system also includes a chassis ground node. The processing device and the measurement circuit can be coupled to the chassis ground node.

While performing isolation resistance monitoring, the measurement circuit can be used to apply a test voltage to a resistor. The test voltage applied by the measurement circuit can be supplied by the auxiliary voltage supply. The resistor can be coupled between the measurement circuit and either the battery pack or battery link. The measurement circuit measures a voltage drop over the resistor and the processing device determines an isolation resistance value between a chassis ground node and the battery pack or battery link based on the voltage drop and other known values.

In some embodiments, the processing device can compare the isolation resistance value to a predetermined threshold and if the isolation resistance value is less than the predetermined threshold, the processing device can generate a fault alert.

Aspects of the present disclosure are cheaper and more simple than conventional approaches. Aspects of the present disclosure require just a single device to perform the isolation resistance monitoring for both the HV battery pack side and HV battery link side. Aspects of the present disclosure do not require two separate processing devices and two isolated 12V voltage supplies as does conventional passive isolation resistance monitoring. Aspects of the present disclosure do not require a separate AC voltage source to power the processing device and the measurement circuit as does conventional active isolation resistance monitoring. Instead, the processing device and the measurement circuit are powered by an auxiliary voltage supply already included in the EV, resulting in a simple and inexpensive design. The processing device can be coupled, for example, to the 12V chassis ground node and can be powered by the same 12V domain. Aspects of the present disclosure do not require the ability to measure negative voltages as does conventional active isolation resistance monitoring. Aspects of the present disclosure can operate in a range of 0V to 5V (e.g., the operating range of the processing device). Aspects of the present disclosure can detect symmetrical faults, which occur when the isolation resistances of both the positive and negative terminals change simultaneously and in a similar manner. Additionally, aspects of the present disclosure can identify asymmetrical faults, which occur when the isolation resistance of either the positive or negative terminal changes, but not both concurrently. Other advantages will be apparent to those skilled in the art of battery management systems design, as will be discussed hereinafter.

FIG. 1 is a block diagram of an isolation resistance measurement system 100, according to some embodiments (also referred to as "system" herein). System 100 includes an isolation resistance monitoring unit 101. Examples of isolation resistance monitoring unit 101 (e.g., as part of an EV system) are shown and discussed in further detail in FIGS. 2-4. Isolation resistance monitoring unit 101 is illustrated as a discrete device (e.g., an integrated circuit with input and output pins) for purposes of illustration, rather than limitation.

Isolation resistance monitoring unit 101 is a specialized sub-system including a measurement circuit and a processing unit. The measurement circuit includes electrical components. For example, components of the measurement circuit may include resistors (e.g., for defining measurement ranges), capacitors (e.g., for filtering and stabilization), a high-impedance voltage sensor (e.g., to detect leakage currents), and a controlled voltage source (e.g., for applying test voltages). In some embodiments, the controlled voltage source need not be integrated as a part of the measurement circuit. Instead, the controlled voltage source may be an auxiliary voltage supply of an EV and may be used to apply test voltages. In some embodiments, the measurement circuit may be used to determine the integrity of the insulation between the high-voltage components and a ground.

In at least one embodiment, the processing unit is a microcontroller. In another embodiment, the processing device is the PSoC™, developed by Cypress Semiconductor, San Jose, CA. In other embodiments, the processing device can be a System on Chip (SoC) or other integrated circuits with the circuitry and functionality described herein. In some embodiments, the processing unit can be a digital signal processor (DSP). In some embodiments, the processing unit processes the data collected by the measurement circuit. In some embodiments, the processing unit can include analog-to-digital converters (ADCs) (e.g., to digitize the analog signals), memory (e.g., for storing measurement data and operational software), and computation logic (e.g., to calculate insulation resistance values). In some embodiments, the processing unit can determine whether the measured insulation resistance values indicate a safe level of insulation or a potential safety hazard, triggering alerts or protective actions as needed.

In some embodiments, isolation resistance monitoring unit 101 may be coupled to a chassis ground node 102. A ground node can be a reference point within an electrical system. In some embodiments, chassis ground node 102 serves as a common return path for electric current and as a reference point for measuring electrical potentials within system 100. In some embodiments, chassis ground node 102 can be used as a reference for measuring the insulation resistance between the high-voltage components (e.g., the battery pack and battery link) and ground, ensuring that there are no dangerous leakages or faults in the insulation.

In some embodiments, isolation resistance measurement system 100 includes an auxiliary voltage supply 103 coupled to isolation resistance monitoring unit 101. Auxiliary voltage supply 103 provides a stable and precise voltage for insulation resistance monitoring (e.g., for applying test voltages). In some embodiments, auxiliary voltage supply can be a regulated power source capable of delivering a consistent voltage level required for accurate measurements. In some embodiments, auxiliary voltage supply 103 may be a 12-volt battery (e.g., of an EV).

In some embodiments, isolation resistance measurement system 100 includes a battery pack 104 (e.g., of a power system 110) coupled to isolation resistance monitoring unit 101. Isolation resistance measurement system 100 further includes a battery link 105 (e.g., of a power system 110). In some embodiments, battery pack 104 is part of an EV. In some embodiments, battery pack 104 is an assembly of multiple battery cells or modules that store electrical energy for operation of, for example, an EV. In some embodiments, battery pack cells can be arranged in a series-parallel configuration to achieve the desired voltage and capacity. In some embodiments, battery pack 104 can includes management systems for monitoring and balancing the cells, temperature control mechanisms, and protective circuitry.

In some embodiments, battery link 105, can also be referred to as the high-voltage interconnect system. Battery link 105 can include components like cables, connectors, and busbars that connect battery pack 104 to the powertrain of the EV and other high-voltage components. In some embodiments, battery link 105 can include an inverter (e.g., for converting DC to AC for the motor), an onboard charger (e.g., for charging the battery from an external AC source), and a DC-DC converter (e.g., to step down high-voltage DC for low-voltage systems).

In an EV, for example, battery pack 104 and the battery link 105 may be coupled together at times and at other times may be decoupled. When coupled, battery link 105 may facilitates power transfer from battery pack 104 to the drivetrain of the EV and other high-voltage components. However, for maintenance, safety, or energy management purposes, battery link 105 can be decoupled or disconnected from battery pack 104. This disconnection can interrupt the power flow, effectively isolating the high-voltage components (battery link 105) from battery pack 104 and ensures safety during servicing or in emergency situations. The ability to decouple can be an important feature for both operational flexibility and safety in EVs. However, the ability to decouple battery pack 104 from battery link 105 presents challenges for isolation resistance monitoring. For example, when decoupled isolation resistance monitoring must be performed for both the battery pack and battery link sides.

Figure 2:
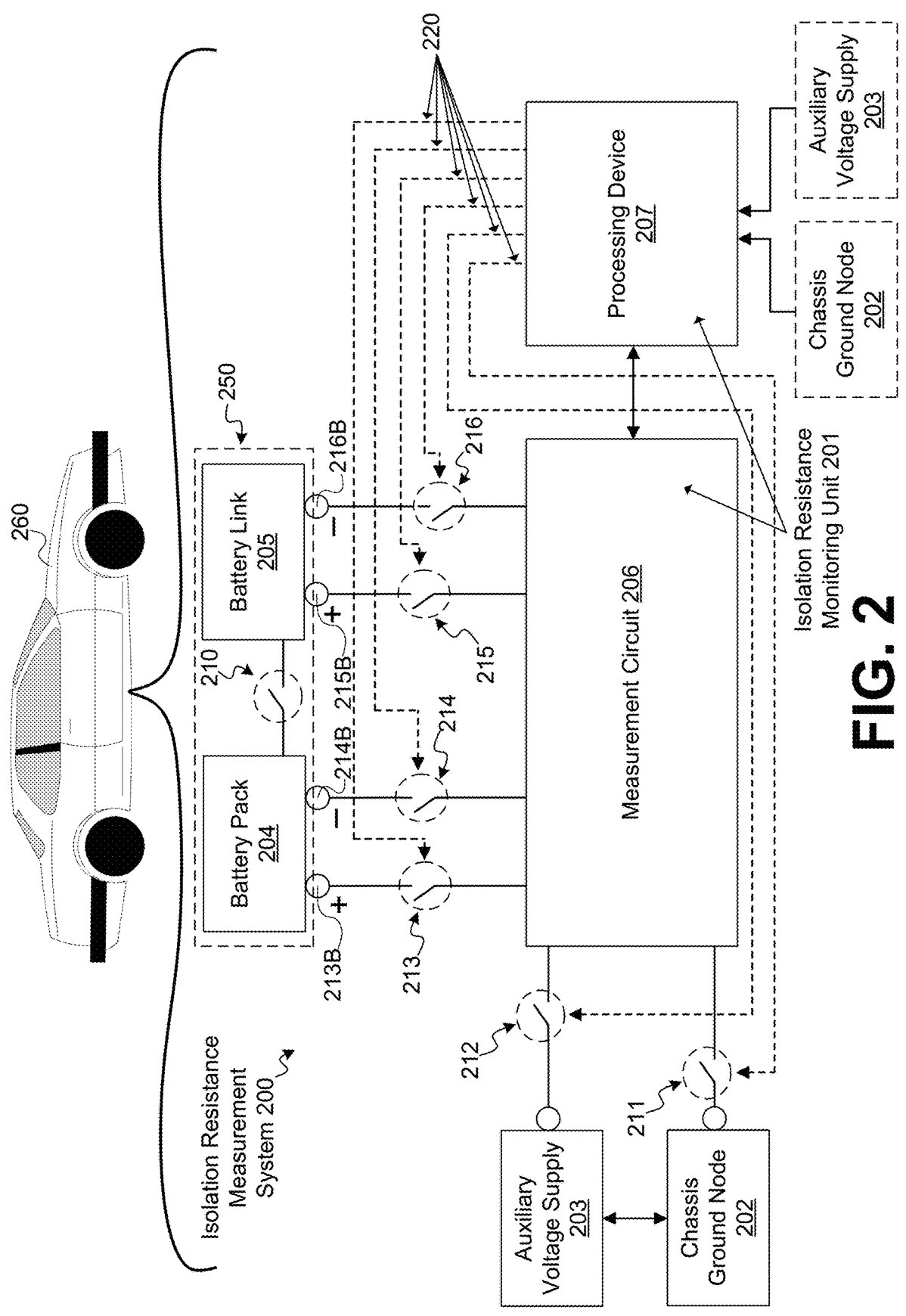
FIG. 2 is a block diagram of an isolation resistance measurement system of an EV, according to some embodiments.

FIG. 2 is a block diagram of an isolation resistance measurement system 200 of an EV, according to some embodiments. Isolation resistance measurement system 200 may be similar to isolation resistance measurement system 100 and may be described with respect to FIG. 1. In some embodiments, isolation resistance measurement system 200 may include or be coupled to the same, more, or fewer components. In some embodiments, isolation resistance measurement system 200 may be included in a EV 260.

In some embodiments, isolation resistance measurement system 200 includes an isolation resistance monitoring unit 201. Isolation resistance monitoring unit 201 can be the same or similar to isolation resistance monitoring unit 101 of FIG. 1. In some embodiments, isolation resistance monitoring unit 201 includes a measurement circuit 206 and a processing device 207.

In some embodiments, measurement circuit 206 is coupled to processing device 207. In some embodiments, measurement circuit 206 includes electrical components. For example, components of the measurement circuit may include resistors, capacitors, a high-impedance voltage sensor, etc. In some embodiments, the measurement circuit may be used to determine the integrity of the insulation between the high-voltage components and a ground. For a more detailed description of measurement circuit 206 see FIGS. 3A-4.

In some embodiments, processing device 207 can be a microcontroller, a DSP, a field programmable gate array (FPGA), an application specific integrated circuit, or the like. In some embodiments, processing device 207 processes data collected by measurement circuit 206. In some embodiments, processing device 207 can include analog-to-digital converters (ADCs), memory, and computation logic, etc.

In some embodiments, processing device 207 and measurement circuit 206 may be coupled to a chassis ground node 202. In some embodiments, a ground node can be a reference point within an electrical system. In some embodiments, chassis ground node 202 serves as a common return path for electric current and as a reference point for measuring electrical potentials within system 200. In some embodiments, chassis ground node 202 can be used as a reference for measuring the insulation resistance between the high-voltage components and ground (e.g., the vehicle chassis). In some embodiments, chassis ground node may correspond to chassis ground node of FIG. 1.

In some embodiments, isolation resistance measurement system 200 includes a battery pack 204 coupled to measurement circuit 206. Isolation resistance measurement system 200 further includes battery link 205 coupled to measurement circuit 206.

In some embodiments, battery pack 204 and the battery link 205 may be selectively coupled or decoupled to each other. When coupled, battery link 205 facilitates power transfer from battery pack 204 to various components of battery link 205 (e.g., the drivetrain of EV 260 and other high-voltage components). However, for maintenance, safety, or energy management purposes, battery link 205 can be decoupled or disconnected from battery pack 204. When decoupled, isolation resistance monitoring must be performed between chassis ground node 202 and both of battery pack 204 and battery link 205. In some embodiments, battery pack 204 and battery link 205 are selectively coupled via switch 210.

In some embodiments, isolation resistance measurement system 200 includes an auxiliary voltage supply 203 coupled to processing device 207 and measurement circuit 206. In some embodiments, processing device 207 and measurement circuit 206 are powered by auxiliary voltage supply 203. In some embodiments, auxiliary voltage supply 203 provides a stable and precise voltage for insulation resistance monitoring (e.g., for applying test voltages).

In some embodiments, isolation resistance measurement system 200 further includes multiple switches coupled between measurement circuit 206 and the battery pack or the battery link 205. In some embodiments, processing device 207 provides control signals 220 to switches 213, 214, 215, and 216. In some embodiments, each switch of switches 213-216, when individually closed, causes the test voltage to be applied to a corresponding terminal (e.g., terminals 213B, 214B, 215B, or 216B) of battery pack 204 or battery link 205. In some embodiments, the test voltage is applied to a terminal of battery pack 204 or battery link 205 of a power system 250 via a resistor. The test voltage may be applied to any one of terminals 213B, 214B, 215B, and 216B, via the resistor.

For example, measurement circuit 206 can apply a test voltage to a first resistor (e.g., coupled to a positive terminal of battery link 205). The test voltage can be connected via switch 215 to a positive terminal (e.g., terminals 215B) of battery link 205. The test voltage can also be connected via switch 216 to a negative (e.g., terminal 216B) of battery link 205. In some embodiments, switch 215 and switch 216 are enabled alternately so that only one of the positive terminal or the negative terminal of battery link 205 is connected to the test voltage at one time. Measurement circuit 206 can measure a first voltage drop over the first resistor while the test voltage is connected via switch 215 to the positive terminal of battery link 205. Measurement circuit 206 can apply the test voltage to the first resistor while the test voltage is connected via switch 216 to the negative terminal of battery link 205. Measurement circuit 206 can measure a second voltage drop over the first resistor while the test voltage is connected via switch 216 to the negative terminal of battery link 205. Processing device 207 can determine, based on the first voltage drop and the second voltage drop, an isolation resistance value (e.g., Riso+ or Riso−) between chassis ground node 202 and at least one of the positive or the negative terminal of battery link 205 of power system 250.

In another example, the test voltage can be connected via switch 213 to a positive terminal (e.g., terminal 213B) of battery pack 204. Measurement circuit 206 can apply the test voltage to a second resistor while the test voltage is connected via switch 213 to the positive terminal of battery pack 204. The test voltage can also be connected via switch 214 to a negative (e.g., terminal 214B) of battery pack 204. In some embodiments, switch 213 and switch 214 are enabled alternately so that only one of the positive terminal or the negative terminal of battery pack 204 is connected to the test voltage at one time. Measurement circuit 206 can measure a third voltage drop over the third resistor while the test voltage is connected via switch 213 to the positive terminal of battery pack 204. Measurement circuit 206 can apply the test voltage to the second resistor while the test voltage is connected via switch 214 to the negative terminal of battery pack 204. Measurement circuit 206 can measure a fourth voltage drop over the second resistor while the test voltage is connected via switch 214 to the negative terminal of battery pack 204. Processing device 207 can determine, based on the third voltage drop and the fourth voltage drop, an isolation resistance value (e.g., Riso+ or Riso−) between chassis ground node 202 and at least one of the positive or negative terminal of battery pack 204 of power system 250. In some embodiments, processing device 207 compares the isolation resistance value (e.g., Riso+ or Riso−) to a predetermined threshold. Processing device 207 further generates an alert in response to the isolation resistance value being less than the predetermined threshold.

In some embodiments, the test voltage applied by measurement circuit 206 is supplied by auxiliary voltage supply 203. In some embodiments, auxiliary voltage supply 203 may be a 12-volt battery (e.g., of EV 260). In some embodiments, the first resistor of the battery link side and the second resistor of the battery pack side can be of the same resistance value. For example, in FIGS. 3A and 3B both the first resistor 371 and the second resistor 372 have the same resistance value and are both represented by R1.

In some embodiments, isolation resistance measurement system 200 further includes a switch 212 coupled between measurement circuit 206 and auxiliary voltage supply 203. In some embodiments, processing device 207 provides control signals 220 to switch 212. In some embodiments, switch 212, when closed, causes the test voltage to be applied to measurement circuit 206.

Figure 3A:
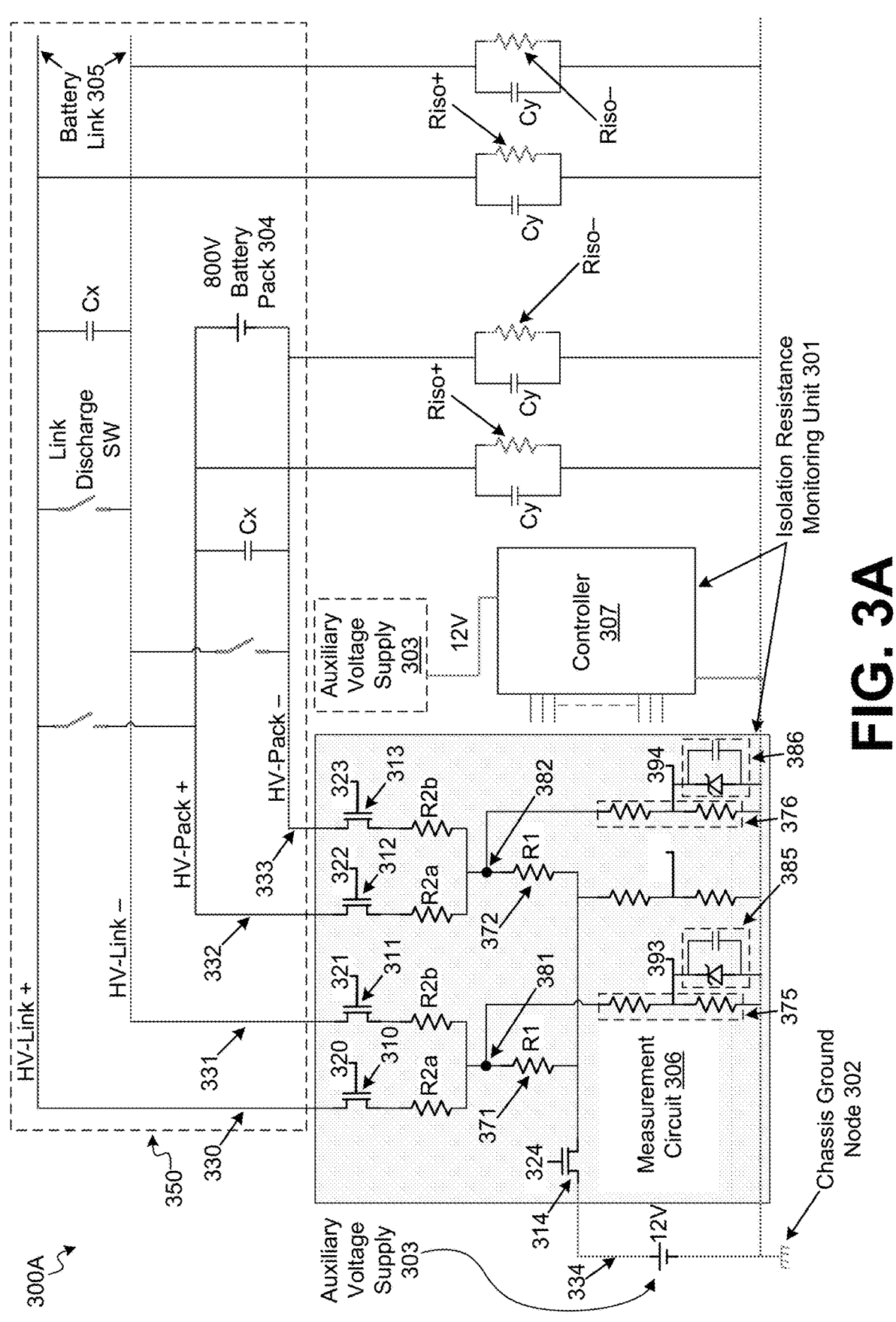
FIG. 3A is a circuit diagram illustrating an isolation resistance measuring circuit, according to some embodiments.

In some embodiments, isolation resistance measurement system 200 further includes a switch 211 coupled between measurement circuit 206 and chassis ground node 202. In some embodiments, processing device 207 provides control signals 220 to switch 211. In some embodiments, switch 211, when closed, causes chassis ground node 202 to be connected to measurement circuit 206. FIG. 3A is a circuit diagram illustrating an isolation resistance measuring circuit 300A, according to some embodiments.

In some embodiments, isolation resistance measuring circuit 300A includes an isolation resistance monitoring unit 301. Isolation resistance monitoring unit 301 can be the same or similar to isolation resistance monitoring unit 101 of FIG. 1 and/or isolation resistance monitoring unit 201 of FIG. 2. In some embodiments, isolation resistance monitoring unit 301 includes a measurement circuit 306 and a controller 307.

In some embodiments, controller 307 can be a microcontroller, a DSP, a field programmable gate array (FPGA), an application specific integrated circuit, or the like. In some embodiments, controller 307 processes data collected by measurement circuit 306. In some embodiments, controller 307 can include analog-to-digital converters (ADCs), memory, and computation logic, etc.

In some embodiments, isolation resistance measuring circuit 300A includes multiple terminals (terminals 330, 331, 332, and 333) coupled to measurement circuit 306. In some embodiments, the terminals include battery pack terminals, battery link terminals, and auxiliary voltage supply terminals. In some embodiments, terminals 330-333 correspond to at least one of a battery pack 304 or a battery link 305. For example, in some embodiments, terminals 330 and 331 correspond to battery link 305. In some embodiments, terminal 330 corresponds to a positive terminal of battery link 305 and terminal 331 corresponds to a negative terminal of battery link 305. In some embodiments, terminals 332 and 333 correspond to battery pack 304. In some embodiments, terminal 332 corresponds to a positive terminal of battery pack 304 and terminal 333 corresponds to a negative terminal of battery pack 304.

In some embodiments, controller 307 is coupled to measurement circuit 306. In some embodiments, measurement circuit 306 and controller 307 are coupled to a chassis ground node 302.

In some embodiments, controller 307 is coupled to multiple switches (switches 310, 311, 312, and 313). In some embodiments, controller 307 provides control signals to switches 310-313. In some embodiments, controller 307 provides control signals to switches 310, 311, 312, and 313 via connection points 320, 321, 322, and 323, respectively. In some embodiments, connection points 320-323 are for digital control. In some embodiments, switches 310-313 are coupled between the measurement circuit and terminals 330-333. In some embodiments, switches controlled by controller 307 may have a gate-driver circuit in between the corresponding connection point and the controller 307.

In some embodiments, isolation resistance measuring circuit 300A includes an auxiliary voltage supply 303. In some embodiments, controller 307 and measurement circuit 306 are coupled to auxiliary voltage supply 303. In some embodiments, controller 307 and measurement circuit 306 are powered by auxiliary voltage supply 303. In some embodiments, measurement circuit 306 applies a test voltage to a first resistor 371. In some embodiments, the test voltage applied by measurement circuit 306 is supplied by auxiliary voltage supply 303. In some embodiments, the test voltage is applied to a terminal corresponding to battery link 305 of the power system 350 via first resistor 371. In some embodiments, the test voltage is applied to a terminal corresponding to battery pack 304 of the power system 350 via a second resistor 372.

In some embodiments, measurement circuit 306 measures a voltage drop over first resistor 371. In some embodiments, the voltage drop can be measured at measurement node 381. In some embodiments, the voltage drop can be measured at measurement node 393. The voltage at node 393 can be adjusted using a voltage divider, which is implemented to divide down the voltage to an appropriate range heling to ensure that the resulting voltage level aligns with the input range of an ADC of controller 307. In some embodiments, controller 307 determines, based on the voltage drop, an isolation resistance value between chassis ground node 302 and battery link 305 of a power system 350. In some embodiments, controller 307 compares the isolation resistance value to a predetermined threshold and generates an alert in response to the isolation resistance value being less than the predetermined threshold.

In some embodiments, measurement circuit 306 measures a voltage drop over second resistor 372. In some embodiments, the voltage drop can be measured at measurement node 382. In some embodiments, the voltage drop can be measured at measurement node 394. The voltage at node 394 can be adjusted using a voltage divider, which is implemented to divide down the voltage to an appropriate range heling to ensure that the resulting voltage level aligns with the input range of an ADC of controller 307. In some embodiments, controller 307 determines, based on the voltage drop, an isolation resistance value between chassis ground node 302 and battery pack 304 of power system 350. In some embodiments, controller 307 compares the isolation resistance value to a predetermined threshold and generates an alert in response to the isolation resistance value being less than the predetermined threshold.

In some embodiments, measurement circuit 306 is coupled to battery pack 304, battery link 305, and auxiliary voltage supply 303 via switches 310, 311, 312, 313, and 314, and terminals 330, 331, 332, 333, and 334.

In some embodiments, switch 314 is coupled between measurement circuit 306 and terminal 334 which corresponds to auxiliary voltage supply 303. In some embodiments, controller 307 provides control signals to switch 314, and switch 314, when closed, causes the test voltage to be applied to measurement circuit 306. In some embodiments, controller 307 provides control signals to switch 314 via connection point 324. In some embodiments, connection point 324 is for digital control. In some embodiments, switches controlled by controller 307 may have a gate-driver circuit in between the corresponding connection point and the controller 307.

In some embodiments, each switch of switches 310, 311, 312, and 313, when individually closed, causes the test voltage to be applied to a corresponding terminal of battery pack 304 or battery link 305. For example, switch 310, when closed, causes the test voltage to be applied to positive terminal 330 of battery link 305. Switch 311, when closed, causes the test voltage to be applied to negative terminal 331 of battery link 305. Switch 312, when closed, causes the test voltage to be applied to positive terminal 332 of battery pack 304. Switch 313, when closed, causes the test voltage to be applied to negative terminal 333 of battery pack 304.

Figure 3B:
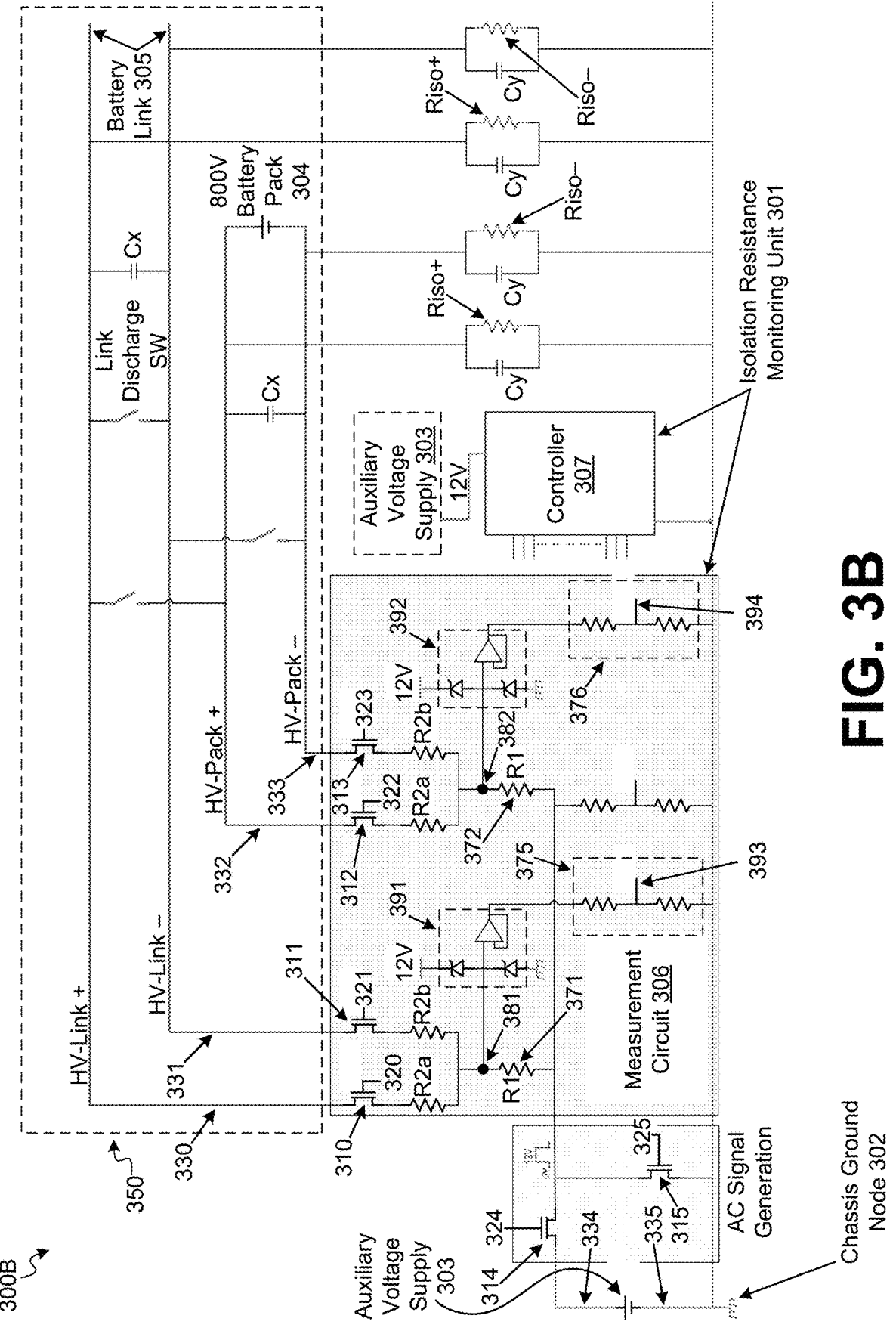
FIG. 3B is a circuit diagram illustrating an isolation resistance measuring circuit, according to some embodiments.

FIG. 3B is a circuit diagram illustrating an isolation resistance measuring circuit 300B, according to some embodiments. FIG. 3B illustrates a variation of the system depicted in FIG. 3A, with similar components and configuration but incorporating a notable difference that will be subsequently explained. For a comprehensive description of the elements common to both figures, please refer to the description provided for FIG. 3A. All elements introduced in FIG. 3A will be referenced directly, without additional introductory details.

In some embodiments, isolation resistance measuring circuit includes a pair of switches. In some embodiments, a first switch 314 can be coupled between measurement circuit 306 and a first terminal 334 corresponding to auxiliary voltage supply 303. In some embodiments, a second switch 315 can be coupled between measurement circuit 306 and a second terminal 335 corresponding to the auxiliary voltage supply. In some embodiments, second terminal 335 is terminal of ground node 302.

In some embodiments, controller 307 provides control signals to switches 314 and 315. In some embodiments, controller 307 provides control signals to switches 314 and 315 via connection points 324 and 325, respectively. In some embodiments, connection points 324 and 325 are for digital control. In some embodiments, switches controlled by controller 307 may have a gate-driver circuit in between the corresponding connection point and the controller 307. In some embodiments, first switch 314, when closed causes a 12-volt test voltage to be applied to measurement circuit 306. In some embodiments, second switch 315, when closed, causes a zero-volt test voltage to be applied to measurement circuit 306. In some embodiments, the zero-volt test voltage is from chassis ground node 302.

In some embodiments, measurement node 381 may not be able to drive a resistor divider 375 to measurement node 393. In some embodiments, measurement node 393 can be a connection point for analog voltages. In some embodiments, a controller buffer 391 can be added to isolation resistance measuring circuit 300B. In some embodiments, the voltage level at measurement node 381 can exceed 12V (out of range) when the 12-volt test voltage is applied to resistor 371 and battery link Riso+ is less than battery link Riso−. In some embodiments, measurement node 381 be less than zero volts (out of range) when the zero-volt test voltage is applied to resistor 371 and battery pack Riso+ is greater than battery pack Riso−. In some embodiments, controller buffer 391 is powered by auxiliary voltage supply 303 (e.g., 12V and 0V). In some embodiments, controller buffer 391 clips the signal from auxiliary voltage supply when the signal is out of range (e.g., exceeding 12V or less than 0V).

In some embodiments, measurement circuit 306 measures the voltage drop over first resistor 371 at measurement node 393. In some embodiments, measurement circuit 306 measures the voltage drop over first resistor 371 at measurement node 381 when the 12-volt test voltage is applied and when the zero-volt test voltage is applied to ensure that at least one measurement value is not being clipped by an operational amplifier (opamp) of controller buffer 391. The 12-volt and zero-volt test voltages are each applied to both the negative and positive terminals of battery pack 304 and battery link 305 (e.g., using switches 310-313 to apply the test voltage to each terminal). In some embodiments, measurement circuit 306 can measure the voltage drop over first resistor 371 at measurement node 381 when an ADC of controller 307 has the capacity to convert relatively high voltages. However, when the ADC of controller 307 is rated for lower voltages, the voltage drop over the first resistor 371 can be measured at measurement node 393. The voltage at node 393 can be adjusted using a voltage divider, which is implemented to divide down the voltage to an appropriate range heling to ensure that the resulting voltage level aligns with the input range of an ADC of controller 307.

In some embodiments, measurement node 382 may not be able to drive a resistor divider 376 to measurement node 394. In some embodiments, measurement node 394 is for analog voltages. In some embodiments, a controller buffer 392 can be added to isolation resistance measuring circuit 300B. In some embodiments, the voltage level at measurement node 382 can exceed 12V (out of range) when the 12-volt test voltage is applied to resistor 372 and battery pack Riso+ is less than battery pack Riso−. In some embodiments, measurement node 382 can be less than zero volts (out of range) when the zero-volt test voltage is applied to resistor 372 and battery link Riso+ is greater than battery link Riso−. In some embodiments, controller buffer 392 is powered by auxiliary voltage supply 303 (e.g., 12V and 0V). In some embodiments, controller buffer 392 clips the signal from auxiliary voltage supply when the signal is out of range (e.g., exceeding 12V or less than 0V).

In some embodiments, a voltage at measurement nodes 393 and 394 (e.g., coupled controller 307) can be negative when the auxiliary voltage supply goes to 0V. In some embodiments, diode clamps 385 and 386 can be added to clamp the negative voltage. In some embodiments, diode clamps 385 and 386 prevent the negative voltage from reaching and potentially damaging controller 307. In some embodiments, an additional buffer from resistor divider 375 or 376 to controller 307 can be added if connection point leakage is an issue. For example, an additional buffer can be added between measurement node 393 and controller 307 and/or between measurement node 394 and controller 307.

In some embodiments, switches controlled by controller 307 may have a gate-driver circuit in between the corresponding connection point and the controller 307.

In some embodiments, measurement circuit 306 measures the voltage drop over second resistor 372 at measurement node 394. In some embodiments, measurement circuit 306 measures the voltage drop over second resistor 372 at measurement node 382 when the 12-volt test voltage is applied and when the zero-volt test voltage is applied to ensure that at least one measurement value is not being clipped by an opamp of controller buffer 392. The 12-volt and zero-volt test voltages are each applied to both the negative and positive terminals of battery pack 304 and battery link 305 (e.g., using switches 310-313 to apply the test voltage to each terminal). In some embodiments, measurement circuit 306 can measure the voltage drop over second resistor 372 at measurement node 382 when an ADC of controller 307 has the capacity to convert relatively high voltages. However, when the ADC of controller 307 is rated for lower voltages, the voltage drop over the second resistor 372 can be measured at measurement node 394. The voltage at node 394 can be adjusted using a voltage divider, which is implemented to divide down the voltage to an appropriate range heling to ensure that the resulting voltage level aligns with the input range of an ADC of controller 307.

In some embodiments, controller 307 determines the isolation resistance values using equations derived by circuit analysis of isolation resistance measuring circuit 300B. The equations will be described in further detail in FIG. 4. In some embodiments, the derivation of the equations for isolation resistance measuring circuit 300B can be similar or the same as the derivation of the equations for isolation resistance measuring circuit 300A. In some embodiments, the equations corresponding to isolation resistance measuring circuit 300B can be used as the equations corresponding to isolation resistance measuring circuit 300A, however, for isolation resistance measuring circuit 300B four measurements are taken for each of the battery pack and battery link. For example, for the battery pack side a measurement is taken when the 12-volt test voltage is applied to positive battery pack terminal, the zero-volt test voltage applied to positive battery pack terminal, the 12-volt test voltage applied to negative battery pack terminal, and the zero-volt test voltage applied to negative battery pack terminal.

In some embodiments, an additional buffer can be added between controller 307 and measurement node 393 if leakage is an issue for measurement node 393. In some embodiments, an additional buffer can be added between controller 307 and measurement node 394 if leakage is an issue for control measurement node 394.

Figure 4:
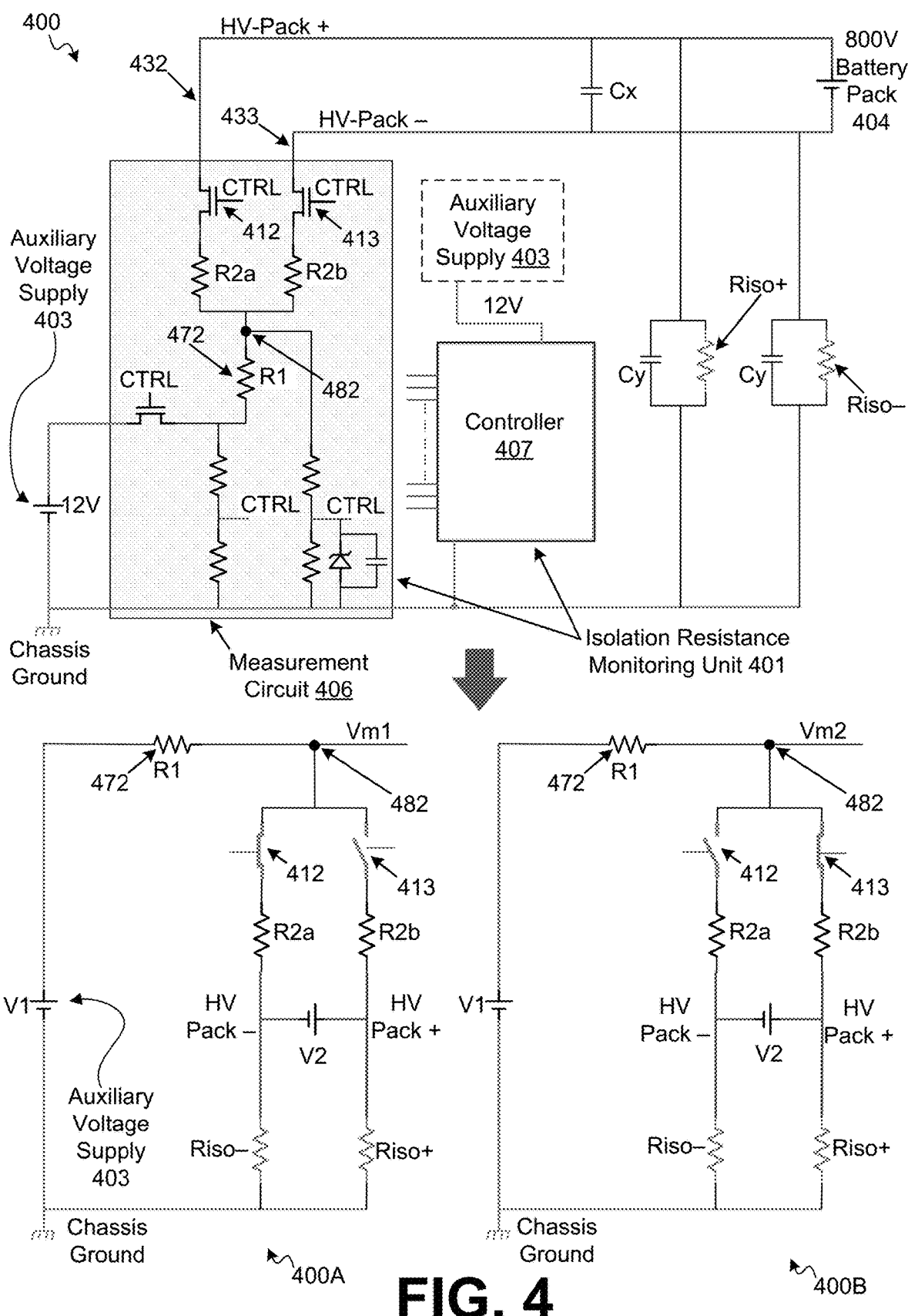
FIG. 4 is a simplified circuit diagram illustrating the use of switches for measuring an isolation resistance value using an isolation resistance measuring circuit, according to some embodiments.

FIG. 4 is a simplified circuit diagram illustrating the use of switches for measuring an isolation resistance value using an isolation resistance measuring circuit 400, according to some embodiments. FIG. 4 illustrates only the positive and negative terminals of a battery pack 404.

In some embodiments, controller 407 may enable switches 410-413 individually to connect the positive and negative terminals of either the battery pack 404 or a battery link (e.g., battery pack 305 of FIGS. 3A and 3B), allowing for two separate voltage measurements (e.g., the first voltage drop and the second voltage drop of FIGS. 3A and 3B) for either of battery pack 404 or the battery link (e.g., battery pack 305 of FIGS. 3A and 3B). Controller 407 can apply a test voltage alternatively to a positive terminal 432 and a negative terminal 433 via resistor 472. Measurement circuit 406 can take voltage measurements across resistor 472 in response to the test voltage being applied alternatively to positive terminal 432 and negative terminal 433. In response to a measurement circuit 406 taking the voltage measurements (e.g., the first voltage drop and the second voltage drop of methods 500A and 500B), Riso+ and Riso− can then be calculated by controller 407 for either battery pack 404 or the battery link (e.g., battery pack 305 of FIGS. 3A and 3B). In some embodiments, an isolation resistance monitoring unit 401 includes controller 407 and measurement circuit 406. In some embodiments, isolation resistance monitoring unit may be connected to battery pack 404 or the battery link. Isolation resistance monitoring unit can take a first voltage measurement and a second voltage measurement corresponding to a positive terminal (e.g., positive terminal 432) and a negative terminal (e.g., negative terminal 433) of battery pack 404 or a positive terminal and a negative terminal of the battery link. Controller 407 can determine an isolation resistance value for battery pack 404 or the battery link based on the corresponding first voltage measurement and second voltage measurement of either battery pack 404 or the battery link.

In some embodiments, DC voltage measurements are completed with an auxiliary voltage supply 403 (e.g., 12V supply) as a test signal. In some embodiments, generating a square-wave signal is not required.

Using the isolation resistance measuring circuit 400 with individual switches for the positive battery pack+and negative battery pack terminals isolation resistance measuring circuit 400 can be simplified to simplified circuits 400A and 400B. In some embodiments, simplified circuit 400A corresponds to applying the test voltage to the negative battery pack terminal and simplified circuit 400B corresponds to applying the test voltage to the positive battery pack terminal. In some embodiments, selectively applying the test voltage to either the positive or negative battery pack terminals is done by controlling switches 412 and 413. To back-calculate Riso+ and Riso− for both battery pack 404 and the battery link (e.g., battery pack 305 of FIGS. 3A and 3B) the voltages of battery pack 404 and the battery link (e.g., battery pack 305 of FIGS. 3A and 3B) need to be known. In some embodiments, a host (e.g., a battery management system controller, vehicle control unit, EV central processor, etc.) will provide the voltage of battery pack 404 and the battery link (e.g., battery pack 305 of FIGS. 3A and 3B) will be discharged to 0V by the system before an isolation resistance measurement is performed.

In some embodiments, as described in previous figures, switches 412 and 413 can be enabled one at a time to allow two different voltages to be measured. For example, when switch 412 is enabled and switch 413 is open voltage Vm1 (corresponding to the negative terminal of battery pack 404) can be measured at measurement node 482. When switch 413 is enabled and switch 412 is open voltage Vm2 (corresponding to the positive terminal of battery pack 404) can be measured at measurement node 482. In some embodiments, the voltages are only measured on the positive 12V edge.

In some embodiments, Vm1 and Vm2 can be used to back-calculate Riso+ and Riso−. For example, the following equations represent Vm1 and Vm2:

$$Vm1 = V1 \cdot \frac{R_{2a} + \frac{R_{iso+} \cdot R_{iso-}}{R_{iso+} + R_{iso-}}}{R1 + R_{2a} + \frac{R_{iso+} \cdot R_{iso-}}{R_{iso+} + R_{iso-}}} +$$

$$V2 \cdot \frac{R_1 \cdot R_{iso+}}{(R_{iso+} + R_{iso-}) \cdot R_1 + (R_{2a} + R_{iso+}) \cdot R_{iso-} + R_{2a} \cdot R_{iso+}}$$

$$Vm2 = V1 \cdot \frac{R_{2b} + \frac{R_{iso+} \cdot R_{iso-}}{R_{iso+} + R_{iso-}}}{R1 + R_{2a} + \frac{R_{iso+} \cdot R_{iso-}}{R_{iso+} + R_{iso-}}} +$$

$$V2 \cdot \frac{R_1 \cdot R_{iso-}}{(R_{iso+} + R_{iso-}) \cdot R_1 + (R_{2b} + R_{iso-}) \cdot R_{iso+} + R_{2b} \cdot R_{iso-}}$$

In some embodiments, V1, R2a, R2b, and R1 are all known values. Riso+ and Riso− can be represented by the following equations:

$$R_{iso+} = \frac{V_2 \cdot R_1 \cdot (R_1 \cdot (V_2 - V_{m1} + V_{m2}) + R_{2a} \cdot (V_1 - V_{m1}) - R_{2b} \cdot (V_1 - V_{m2}))}{\begin{array}{c} R_1 \cdot (V_2 \cdot (V_1 - V_{m2}) - V_1 \cdot (V_{m1} - V_{m2})) + \\ (R_{2a} - R_{2b}) \cdot (V_1^2 - V_1 \cdot (V_{m1} + V_{m2}) + V_{m1} \cdot V_{m2}) \end{array}}$$

$$R_{iso-} = \frac{\begin{array}{c} -V_2 \cdot R_1 \cdot (R_1 \cdot (V_2 - V_{m1} + V_{m2}) + R_{2a} \cdot (V_1 - V_{m1}) - \\ R_{2b} \cdot (V_1 - V_{m2})) \end{array}}{\begin{array}{c} V_2 \cdot R_1 \cdot (V_1 - V_{m1}) + R_{2a} \cdot (V_1 - V_{m1}) \cdot (V_1 - V_{m2}) - \\ V_1 \cdot (R_{2b} \cdot V_1 - R_{2b} \cdot V_{m1} + R_1 \cdot V_{m1}) + V_1 \cdot V_{m2}(R_{2b} + R_1) - \\ R_{2b} \cdot V_{m1} \cdot V_{m2} \end{array}}$$

Figure 5A:
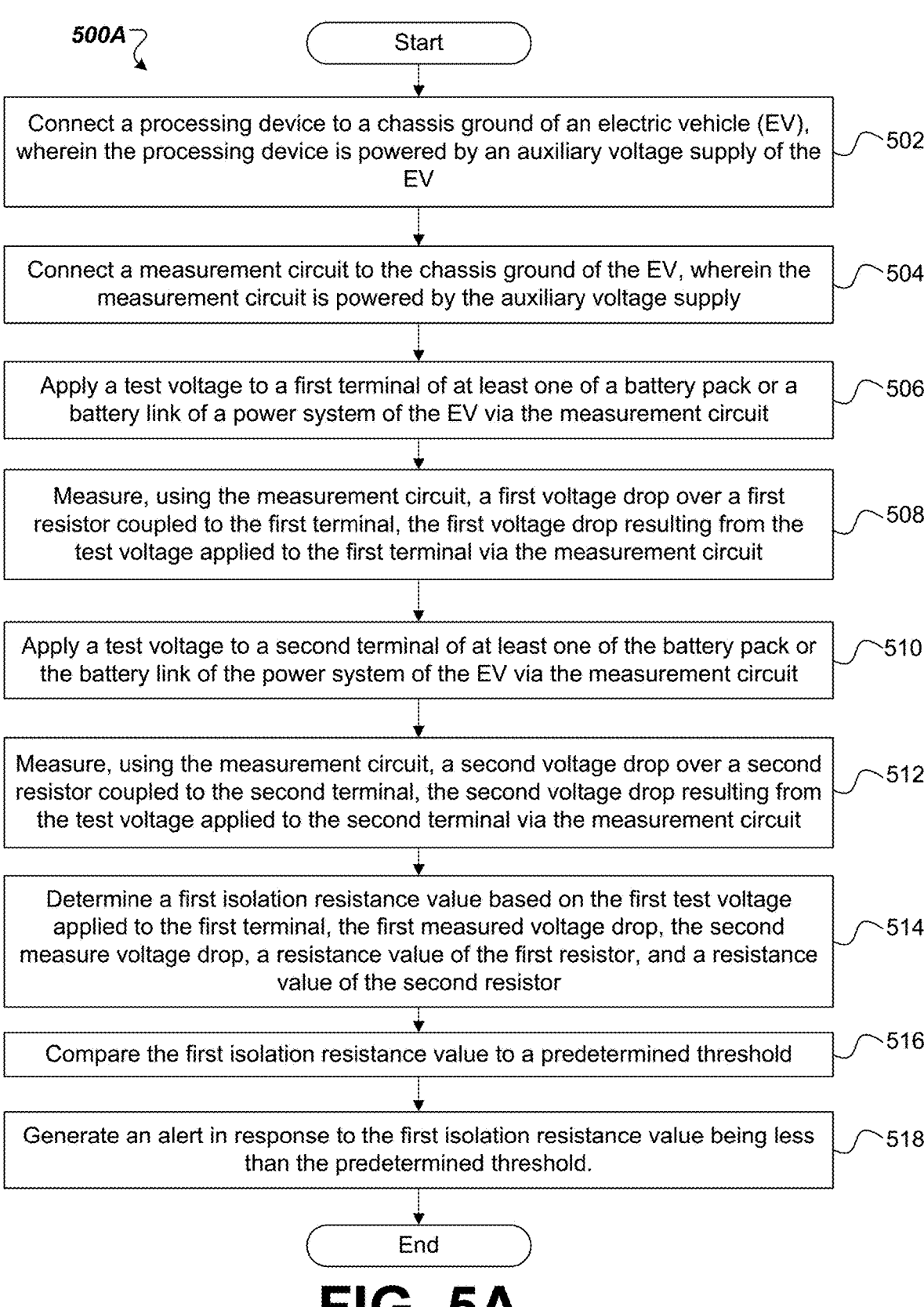
FIG. 5A is a flow diagram of a method associated with isolation resistance monitoring, according to some embodiments.

FIGS. 5A-B are flow diagrams of a methods associated with isolation resistance monitoring, according to some embodiments. The methods 500A-B may be performed by processing logic that comprises hardware (e.g., circuitry, dedicated logic, programmable logic, microcode, etc.), software (such as instructions run on a processing device), or a combination thereof. The methods 500A-B may be performed wholly or in part by isolation resistance monitoring unit 101, isolation resistance measurement system 100, isolation resistance measurement system 200, isolation resistance measuring circuit 300A, isolation resistance measuring circuit 300B, or components thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

FIG. 5A is a flow diagram of a method 500A associated with isolation resistance monitoring, according to some embodiments.

In some embodiments, method 500A may be a method of monitoring isolation resistance using an isolation resistance monitoring unit.

Method 500A begins at operation 502, where the processing logic connects a processing device to a chassis ground of an EV, wherein the processing device is powered by an auxiliary voltage supply of the EV.

At operation 504, the processing logic connects a measurement circuit to the chassis ground of the EV, where the measurement circuit is powered by the auxiliary voltage supply.

At operation 506, the processing logic applies a test voltage to a first terminal of at least one of a battery pack or a battery link of a power system of the EV via the measurement circuit. In some embodiments, the first terminal is a positive terminal.

At operation 508, the processing logic measures, using the measurement circuit, a first voltage drop over a first resistor coupled to the first terminal, the first voltage drop resulting from the test voltage applied to the first terminal via the measurement circuit.

At operation 510 the processing logic applies the test voltage to a second terminal of at least one of the battery pack or the battery link of the power system of the EV via the measurement circuit. In some embodiments, the second terminal is a negative terminal, and the first terminal is a corresponding positive terminal (e.g., of the battery pack or battery link). In some embodiments, a set of switches are coupled between the measurement circuit and a positive terminal and a negative terminal of the at least one of the battery pack and battery link. In some embodiments, applying the test voltage to the first terminal includes closing a first switch and opening a second switch of the set of switches to apply the test voltage to the first terminal. In some embodiments, applying the test voltage to the second terminal includes opening the first switch and closing the second switch of the set of switches to apply the test voltage to the second terminal.

At operation 512 the processing logic measures, using the measurement circuit, a second voltage drop over the first resistor coupled to the second terminal, the second voltage drop resulting from the test voltage applied to the second terminal via the measurement circuit. In some embodiments, a set of switches is coupled between the measurement circuit and a positive terminal and a negative terminal of the at least one of the battery pack and battery link.

At operation 514 the processing logic determines a first isolation resistance value based on at least the first test voltage applied to the first terminal (e.g., same as the test voltage applied to the first terminal), the first measured voltage drop, the second measured voltage drop, and a resistance value of the first resistor. In some embodiments, the determining the first isolation resistance value can be further based on a voltage drop across the first terminal and second terminal (e.g., V2 of FIG. 4). For example, the voltage drop across the first terminal and second terminal may be a voltage drop across a positive terminal and a negative terminal of either the battery pack or battery link of the power system of the EV.

At operation 516, the processing logic compares the first isolation resistance value to a predetermined threshold.

At operation 518, the processing logic generates an alert in response to the first isolation resistance value being less than the predetermined threshold.

FIG. 5B is a flow diagram of a method 500B associated with isolation resistance monitoring, according to some embodiments. In some embodiments, method 500B may include some or all of the operations of method 500A as well as additional operations outlined in FIG. 5B.

In some embodiments, method 500B may be a method of monitoring isolation resistance using an isolation resistance monitoring unit.

Method 500B begins at operation 526, where the processing logic determines a second isolation resistance value based on the test voltage applied to the second terminal (e.g., same as the test voltage applied to the first terminal), the first measured voltage drop, the second measure voltage drop, and the resistance value of the first resistor. In some embodiments, the determining the second isolation resistance value can be further based on a voltage drop across the first terminal and second terminal (e.g., V2 of FIG. 4). For example, the voltage drop across the first terminal and second terminal may be a voltage drop across a positive terminal and a negative terminal of either the battery pack or battery link of the power system of the EV.

At operation 528, the processing logic compares the second isolation resistance value to a predetermined threshold.

At operation 530, the processing logic generates an alert in response to the second isolation resistance value being less than the predetermined threshold.

In some embodiments, a pair of switches are coupled between the measurement circuit and a positive and a negative terminal of the auxiliary voltage supply. In some embodiments, applying the test voltage includes closing a first switch of the pair of switches and opening a second switch of the pair of switches to apply a 12-volt test voltage. In some embodiments, applying the test voltage includes opening the first switch of the pair of switches and closing the second switch of the pair of switches apply a zero-volt test voltage.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "adjusting," "measuring," "determining," "comparing," "generating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "some embodiments" throughout is not intended to mean the same embodiment or embodiments unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMS, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, and any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or presented in simple block diagram format to avoid unnecessarily obscuring the present disclosure. Thus, the specific details set forth above are merely exemplary. Particular embodiments may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

In the above description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment," "an embodiment," or "some embodiments" means that a particular feature, structure, or characteristic described in connection with the embodiment(s) is included in at least one embodiment of the disclosure. The phrase "in one embodiment" or "in some embodiments" located in various places in this description does not necessarily refer to the same embodiment(s).

What is claimed is:

1. A system comprising:
a processing device;
a measurement circuit coupled to the processing device;
an auxiliary voltage supply, wherein the processing device and the measurement circuit are powered by the auxiliary voltage supply, wherein the measurement circuit is to apply a test voltage to a resistor and measure a voltage drop over the resistor, and wherein the processing device is to determine, based on at least the voltage drop, an isolation resistance value between a chassis ground node and at least one of a battery pack or a battery link of a power system, and;
a pair of switches, wherein:
    a first switch of the pair of switches is coupled between the measurement circuit and the auxiliary voltage supply; and
    a second switch of the pair of switches is coupled between the measurement circuit and the chassis ground node, wherein the first switch, when closed, causes a 12-volt test voltage to be applied to the measurement circuit, and wherein the second switch, when closed, causes a zero-volt test voltage to be applied to the measurement circuit.

2. The system of claim 1, wherein the processing device and the measurement circuit are coupled to the chassis ground node.

3. The system of claim 1, wherein the test voltage applied by the measurement circuit is supplied by the auxiliary voltage supply.

4. The system of claim 1, wherein the test voltage is applied to a terminal of the at least one of the battery pack or the battery link of the power system via the resistor, and wherein the processing device is to:
    compare the isolation resistance value to a predetermined threshold; and
    generate an alert in response to the isolation resistance value being less than the predetermined threshold.

5. The system of claim 1, wherein the auxiliary voltage supply is a 12-volt battery.

6. An isolation resistance measuring circuit comprising:
a plurality of terminals;
a measurement circuit coupled to the plurality of terminals;
a controller coupled to the measurement circuit, wherein the controller is coupled to and provides control signals to a plurality of switches coupled between the measurement circuit and the plurality of terminals; and
an auxiliary voltage supply, wherein the controller and the measurement circuit are powered by the auxiliary voltage supply, wherein the measurement circuit is to apply a test voltage to a resistor and measure a voltage drop over the resistor, and wherein the controller is to determine, based on at least the voltage drop, an isolation resistance value between a chassis ground node and at least one of a battery pack or a battery link of a power system.

7. The isolation resistance measuring circuit of claim 6, wherein the controller and the measurement circuit are coupled to the chassis ground node.

8. The isolation resistance measuring circuit of claim 6, wherein the test voltage applied by the measurement circuit is supplied by the auxiliary voltage supply.

9. The isolation resistance measuring circuit of claim 6, wherein the measurement circuit is coupled to the battery pack, the battery link, and the auxiliary voltage supply via the plurality of switches and the plurality of terminals.

10. The isolation resistance measuring circuit of claim 9, wherein a switch of the plurality of switches is coupled between the measurement circuit and a terminal of plurality of terminal corresponding to the auxiliary voltage supply, wherein the controller is to provide control signals to the switch, and wherein the switch, when closed, causes the test voltage to be applied to the measurement circuit.

11. The isolation resistance measuring circuit of claim 9, wherein a pair of switches of the plurality of switches comprises:
    a first switch coupled between the measurement circuit and a first terminal of plurality of terminals corresponding to the auxiliary voltage supply; and
    a second switch coupled between the measurement circuit and a second terminal of plurality of terminals corresponding to the auxiliary voltage supply, wherein the first switch, when closed, causes a 12-volt test voltage to be applied to the measurement circuit, and wherein the second switch, when closed, causes a zero-volt test voltage to be applied to the measurement circuit.

12. The isolation resistance measuring circuit of claim 6, wherein each switch of the plurality of switches, when individually closed, causes the test voltage to be applied to a corresponding terminal of the at least one of the battery pack or the battery link.

13. The isolation resistance measuring circuit of claim 8, wherein the plurality of terminals comprise;
    battery pack terminals;
    battery link terminals; and
    auxiliary voltage supply terminals, wherein the test voltage is applied to a terminal of the plurality of terminals corresponding to the at least one of the battery pack or the battery link of the power system via the resistor, and wherein the controller is to:
        compare the isolation resistance value to a predetermined threshold; and
        generate an alert in response to the isolation resistance value being less than the predetermined threshold.

14. A method comprising:
    connecting a processing device to a chassis ground of an electric vehicle (EV), wherein the processing device is powered by an auxiliary voltage supply of the EV;
    connecting a measurement circuit to the chassis ground of the EV, wherein the measurement circuit is powered by the auxiliary voltage supply;
    applying a test voltage to a first terminal of at least one of a battery pack or a battery link of a power system of the EV via the measurement circuit;
    measuring, using the measurement circuit, a first voltage drop over a first resistor coupled to the first terminal, the first voltage drop resulting from the test voltage applied to the first terminal via the measurement circuit;
    applying the test voltage to a second terminal of the at least one of the battery pack or the battery link of the power system of the EV via the measurement circuit measuring, using the measurement circuit, a second voltage drop over the first resistor coupled to the second terminal, the second voltage drop resulting from the test voltage applied to the second terminal via the measurement circuit;

determining a first isolation resistance value based on the test voltage applied to the first terminal, the first measured voltage drop, the second measured voltage drop, and a resistance value of the first resistor;

comparing the first isolation resistance value to a predetermined threshold; and generating an alert in response to the first isolation resistance value being less than the predetermined threshold.

15. The method of claim 14, wherein the method further comprises:

determining a second isolation resistance value based on the test voltage applied to the second terminal, the first measured voltage drop, the second measured voltage drop, and the resistance value of the first resistor;

comparing the second isolation resistance value to a predetermined threshold; and generating an alert in response to the second isolation resistance value being less than the predetermined threshold.

16. The method of claim 14, wherein a plurality of switches are coupled between the measurement circuit and a positive terminal and a negative terminal of the at least one of the battery pack and the battery link, and wherein applying the test voltage to the first and second terminals comprises:

closing a first switch and opening a second switch of the plurality of switches to apply the test voltage to the first terminal; and opening the first switch and closing the second switch of the plurality of switches to apply the test voltage to the second terminal.

17. The method of claim 14, wherein a pair of switches are coupled between the measurement circuit and a positive terminal and a negative terminal of the auxiliary voltage supply, and wherein applying the test voltage comprises:

closing a first switch of the pair of switches and opening a second switch of the pair of switches to apply a 12-volt test voltage; and opening the first switch of the pair of switches and closing the second switch of the pair of switches apply a zero-volt test voltage.

* * * * *